United States Patent
Adachi et al.

(10) Patent No.: US 8,917,750 B2
(45) Date of Patent: Dec. 23, 2014

(54) III-NITRIDE SEMICONDUCTOR LASER DIODE

(75) Inventors: Masahiro Adachi, Osaka (JP); Shinji Tokuyama, Osaka (JP); Yohei Enya, Itami (JP); Takashi Kyono, Itami (JP); Yusuke Yoshizumi, Itami (JP); Katsushi Akita, Itami (JP); Masaki Ueno, Itami (JP); Koji Katayama, Osaka (JP); Takatoshi Ikegami, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/328,622

(22) Filed: Dec. 16, 2011

(65) Prior Publication Data

US 2012/0128016 A1   May 24, 2012

Related U.S. Application Data

(63) Continuation of application No. PCT/JP2010/060296, filed on Jun. 17, 2010.

(30) Foreign Application Priority Data

Jun. 19, 2009 (JP) ................................. 2009-146701
Sep. 30, 2009 (JP) ................................. 2009-228824

(51) Int. Cl.
*H01S 5/00* (2006.01)
*H01S 5/343* (2006.01)
(Continued)

(52) U.S. Cl.
CPC ........... *H01S 5/2004* (2013.01); *H01S 5/34333* (2013.01); *H01S 2301/18* (2013.01);
(Continued)

(58) Field of Classification Search
CPC ............................ H01S 5/3202; H01S 5/32341
See application file for complete search history.

(56) References Cited

U.S. PATENT DOCUMENTS 5,987,048 A * 11/1999 Ishikawa et al. ............ 372/46.01
6,693,935 B2 * 2/2004 Tojo et al. ................... 372/45.01
(Continued)

FOREIGN PATENT DOCUMENTS

CN   101043121 A   9/2007
CN   101442094 A   5/2009
(Continued)

OTHER PUBLICATIONS

Tyagi et al., "Stimulated Emission at Blue-Green (480 nm) and Green (514 nm) Wavelengths from Nonpolar (m-plane) and Semipolar (11$\bar{2}$2) InGaN Multiple Quantum Well Laser Diode Structures," Applied Physics Express 1, pp. 091103-1-091103-3 (2008).
(Continued)

*Primary Examiner* — Armando Rodriguez
*Assistant Examiner* — Sean Hagan
(74) *Attorney, Agent, or Firm* — Venable LLP; Michael A. Sartori; Tamatane J. Aga (57) ABSTRACT

Provided is a III-nitride semiconductor laser diode which is capable of lasing at a low threshold. A support base has a semipolar or nonpolar primary surface. The c-axis Cx of a III-nitride is inclined relative to the primary surface. An n-type cladding region and a p-type cladding region are provided above the primary surface of the support base. A core semiconductor region is provided between the n-type cladding region and the p-type cladding region. The core semiconductor region includes a first optical guide layer, an active layer, and a second optical guide layer. The active layer is provided between the first optical guide layer and the second optical guide layer. The thickness of the core semiconductor region is not less than 0.5 μm. This structure allows the confinement of light into the core semiconductor region without leakage of light into the support base, and therefore enables reduction in threshold current.

22 Claims, 5 Drawing Sheets

(51) Int. Cl.
*H01S 5/32* (2006.01)
*H01S 5/20* (2006.01)
*B82Y 20/00* (2011.01)
*H01S 5/30* (2006.01)
*H01S 5/22* (2006.01)

(52) U.S. Cl.
CPC ........... *H01S 2302/00* (2013.01); *H01S 5/3202*
(2013.01); *B82Y 20/00* (2013.01); *H01S 5/309*
(2013.01); *H01S 5/22* (2013.01)
USPC ............... 372/44.011; 372/50.12; 372/50.121

(56) References Cited

U.S. PATENT DOCUMENTS

| | | | |
|---|---|---|---|
| 8,741,674 B2 * | 6/2014 | Yoshizumi et al. | 438/33 |
| 2006/0193359 A1 * | 8/2006 | Kuramoto | 372/45.01 |
| 2008/0285609 A1 * | 11/2008 | Ohta et al. | 372/44.011 |
| 2009/0130790 A1 | 5/2009 | Kanamoto et al. | |

FOREIGN PATENT DOCUMENTS

| | | |
|---|---|---|
| JP | 2001-057460 A | 2/2001 |
| JP | 2002-270971 A | 9/2002 |
| JP | 2006-128661 A | 5/2006 |
| JP | 2007-243219 | 9/2007 |
| JP | 2008-060375 A | 3/2008 |
| JP | 2008-311640 A | 12/2008 |
| JP | 2009-071341 | 4/2009 |
| JP | 2009-076858 | 4/2009 |
| JP | 2009-129973 A | 6/2009 |

OTHER PUBLICATIONS

Office Action in Chinese Patent Application No. 201080026837.3, dated Dec. 25, 2012.

* cited by examiner

Fig.5

III-NITRIDE SEMICONDUCTOR LASER DIODE

CROSS REFERENCE TO RELATED APPLICATIONS

This is a continuation of PCT application No. PCT/JP2010/060296 filed on Jun. 17, 2010, claiming the benefit of priorities from Japanese Patent application No. 2009-146701 filed on Jun. 19, 2009, and Japanese Patent application No. 2009-228824 filed on Sep. 30, 2009.

TECHNICAL FIELD

The present invention relates to a III-nitride semiconductor laser diode.

BACKGROUND ART

Patent Literature 1 describes a Fabry-Perot type semiconductor laser diode. An n-type semiconductor layer, a light emitting layer, and a p-type semiconductor layer are stacked in the m-axis direction. The n-type semiconductor layer includes an n-type GaN cladding layer and an n-type InGaN layer, and the p-type semiconductor layer includes a p-type GaN cladding layer and a p-type InGaN layer. A refractive index difference between the cladding layers and the optical guide layers is not less than 0.04. Patent Literature 2 describes a laser device with the emission wavelength of 425 nm-450 nm. Patent Literature 3 describes a laser device which achieves improvement in the aspect ratio of the far field pattern of emission. The p-side optical guide layer of this laser device has a striped protrusion and the emission wavelength of the device is in the range of 370 nm to 470 nm. Non-Patent Literature 1 describes an InGaN/GaN multiple quantum well structure grown on a (11-22) plane. Emission at the wavelength of 514 nm is obtained by optical pumping.

CITATION LIST

Patent Literature

Patent Literature 1: Japanese Patent Application Laid-open No. 2008-311640
Patent Literature 2: Japanese Patent Application Laid-open No. 2002-270971
Patent Literature 3: Japanese Patent Application Laid-open No. 2001-57460

NON-PATENT LITERATURE

Non-Patent Literature 1: Anurag et al. Applied Physics Express 1 (2008) 091103

SUMMARY OF INVENTION

Technical Problem

There are demands for green semiconductor lasers with the lasing wavelength of not less than 500 nm. For example, a green laser which is currently available makes use of second harmonic generation (SHG). This laser diode has a short lifetime and high power consumption. The reason is that the device makes use of wavelength conversion from long-wavelength light to short wavelength of high energy. There are thus desires for a green laser diode making no use of the wavelength conversion.

Gallium nitride based semiconductor light emitting devices are candidates for semiconductor lasers with the lasing wavelength of not less than 500 nm. Inventors' investigation has found that in the implementation of the laser diodes with the wavelength of not less than 500 nm, it is important to make light stably confine into a core semiconductor region which includes the active layer and guide layers. The conventional structures for laser diodes with the wavelength of not less than 500 nm failed to make light in the LED mode stably confine into the core semiconductor region.

In Patent Literature 1, the optical guide layers are made of InGaN only, in order to achieve the refractive index difference of not less than 0.04 between the cladding layers and the optical guide layers. According to Inventors' knowledge, however, when this structure is applied to laser diodes aiming at the lasing wavelength of not less than 500 nm, the threshold current density becomes very high. This makes practical lasing difficult. On the other hand, this structure is applicable to the ultraviolet laser diodes of about 400 nm, but the refractive index difference between the core semiconductor region and the cladding layers is insufficient for the lasing wavelengths of not less than green or 500 nm because of chromatic dispersion. Inventors' investigation has found that, for example, in the wavelength region of not less than 500 nm, light which is to be confined into the core semiconductor region has amplitude in the substrate.

It is an object of the present invention to provide a III-nitride semiconductor laser diode capable of lasing at a low threshold.

SOLUTION TO PROBLEM

One aspect of the present invention relates to a III-nitride semiconductor laser diode to generate light at a wavelength of not less than 490 nm. This III-nitride semiconductor laser diode comprises: (a) a support base having a semipolar or nonpolar primary surface and comprising a III-nitride; (b) an n-type cladding region provided above the support base; (c) a p-type cladding region provided above the support base; and (d) a core semiconductor region provided between the p-type cladding region and the n-type cladding region. The n-type cladding region comprises an n-type gallium nitride based semiconductor; the p-type cladding region comprises a p-type gallium nitride based semiconductor; the core semiconductor region comprises a first optical guide layer, an active layer, and a second optical guide layer; the active layer is provided between the first optical guide layer and the second optical guide layer; a thickness of the core semiconductor region is not less than 0.5 μm.

In this III-nitride semiconductor laser diode, the core semiconductor region includes the first optical guide layer, active layer, and second optical guide layer, and the thickness of the core semiconductor region is not less than 0.5 μm. This structure allows the confinement of light into the core semiconductor region without broadening of light into the support base, and therefore achieves reduction in threshold current.

In the III-nitride semiconductor laser diode according to the present invention, preferably, the first optical guide layer includes a first GaN layer and a first InGaN layer, the first GaN layer is provided between the n-type cladding region and the first InGaN layer, and the n-type cladding region is provided between the first GaN layer and the support base. In this III-nitride semiconductor laser diode, the first optical guide layer includes the GaN layer and the InGaN layer, and the n-type cladding region and the GaN layer of the first optical guide layer are provided between the support base and the InGaN layer of the first optical guide layer. For this reason, the semiconductor region from the support base to the active layer is provided with a refractive index profile and a core semiconductor region width which are suitable for optical confinement. In the III-nitride semiconductor laser diode according to the present invention, preferably, the second optical guide layer includes a second GaN layer and a second InGaN layer and the second GaN layer is provided between the p-type cladding region and the second InGaN layer. In this III-nitride semiconductor laser diode, since the second GaN layer of the second optical guide layer is provided between the p-type cladding region and the second InGaN layer, the semiconductor region from the active layer to the p-type cladding region is provided with a refractive index profile and a core semiconductor region width which are suitable for optical confinement, as well as the semiconductor region on the n-type cladding region side.

In the III-nitride semiconductor laser diode according to the present invention, preferably, the first InGaN layer is undoped, the first GaN layer exhibits n-type, the second InGaN layer is undoped, and the second GaN layer exhibits p-type.

In this III-nitride semiconductor laser diode, since the first and second InGaN layers are undoped, it is feasible to avoid dopant absorption of light. Furthermore, since the first and second GaN layers are doped with respective dopants, the electrical resistance of the device is reduced.

In the III-nitride semiconductor laser diode according to the present invention, preferably, the sum of thicknesses of the first GaN layer and the second GaN layer is not less than 450 nm, and the sum of thicknesses of the first InGaN layer and the second InGaN layer is smaller than the thickness of the first GaN layer. This III-nitride semiconductor laser diode can provide a low threshold.

In the III-nitride semiconductor laser diode according to the present invention, preferably, the sum of thicknesses of the first GaN layer and the second GaN layer is not less than 550 nm. This III-nitride semiconductor laser diode enables a lower threshold.

In the III-nitride semiconductor laser diode according to the present invention, preferably, an In composition of the first InGaN layer is not less than 1%. This III-nitride semiconductor laser diode can provide a lower threshold.

In the III-nitride semiconductor laser diode according to the present invention, preferably, the n-type cladding region includes an $Al_XGa_{1-X}N$ ($0.03<X<0.10$) layer. In this III-nitride semiconductor laser diode, since the n-type AlGaN layer is provided between the support base and the active layer, this structure suitably confines light into the core semiconductor region without leakage of light into the support base. This allows the threshold current to be reduced. In the III-nitride semiconductor laser diode according to the present invention, preferably, the p-type cladding region includes an $Al_YGa_{1-Y}N$ ($0.03<Y<0.10$) layer. In this III-nitride semiconductor laser diode, a preferable refractive index profile and core semiconductor region width in the p-side semiconductor region can confines light into the core semiconductor region without spread of light into the support base.

In the III-nitride semiconductor laser diode according to the present invention, preferably, an Al composition of the $Al_XGa_{1-X}N$ of the n-type cladding region is not less than 0.05. The structure of this III-nitride semiconductor laser diode is more suitable for confining light into the core semiconductor region without broadening of light into the support base. In the III-nitride semiconductor laser diode according to the present invention, preferably, an Al composition of the $Al_YGa_{1-Y}N$ of the p-type cladding region is not less than 0.05. In this III-nitride semiconductor laser diode, since the p-side semiconductor region has a better refractive index profile, the profile can confine light into the core semiconductor region without leakage of light into the support base.

The III-nitride semiconductor laser diode according to the present invention can be configured as follows: an inclination angle of the primary surface is in the range of not less than 10 degrees and not more than 80 degrees and in the range of not less than 100 degrees and not more than 170 degrees with respect to a reference plane perpendicular to the c-axis of the III-nitride, the support base comprises GaN, and the active layer comprises an InGaN layer. This III-nitride semiconductor laser diode can provide the semipolar nature of GaN.

In the III-nitride semiconductor laser diode according to the present invention, preferably, the inclination angle is in the range of not less than 63 degrees and not more than 80 degrees and in the range of not less than 100 degrees and not more than 117 degrees with respect to the reference plane. This III-nitride semiconductor laser diode can provide the InGaN layer suitable for the active layer for emission of not less than 500 nm.

In the III-nitride semiconductor laser diode according to the present invention, preferably, the active layer is provided so as to generate light of a wavelength in the range of not less than 490 nm and not more than 510 nm, and a thickness of the core semiconductor region is in the range of not less than 0.5 µm and not more than 1.5 µm. This III-nitride semiconductor laser diode can provide a low threshold in emission in the wavelength range of not less than 490 nm and not more than 510 nm.

The III-nitride semiconductor laser diode according to the present invention can be configured as follows: the active layer is provided so as to generate light of a wavelength in the range of not less than 500 nm and not more than 520 nm, and a thickness of the core semiconductor region is not less than 0.6 µm and not more than 1.5 µm. This III-nitride semiconductor laser diode can provide a low threshold in emission in the wavelength range of not less than 500 nm and not more than 520 nm.

In the III-nitride semiconductor laser diode according to the present invention, the second optical guide layer is provided between the p-type cladding region and the active layer, the p-type cladding region and the second optical guide layer have a ridge structure, the second optical guide layer includes a ridge portion for the ridge structure and a side portion adjacent to the ridge portion, and a thickness of the side portion is not more than half of a thickness of the ridge portion. This III-nitride semiconductor laser diode uses the ridge structure, which can achieve a threshold current in emission in the wavelength range of not less than 500 nm and not more than 520 nm.

The III-nitride semiconductor laser diode according to the present invention can further comprise a confining portion provided on the ridge structure. The confining portion has a refractive index smaller than that of the second optical guide layer. In this III-nitride semiconductor laser diode, the confining portion can provide excellent optical confinement.

In the III-nitride semiconductor laser diode according to the present invention, the thickness of the side portion of the second optical guide layer can be not less than 10 nm and not more than 250 nm. In this III-nitride semiconductor laser diode, when the thickness of the side portion is not less than 10 nm, the active layer can be well protected. When the thickness of the side portion is not more than 250 nm, the ridge structure can guide electric current to the active layer.

In the III-nitride semiconductor laser diode according to the present invention, the thickness of the side portion of the second optical guide layer can be not less than 10 nm and is preferably not more than 200 nm. In this III-nitride semiconductor laser diode, when the thickness of the side portion is not more than 200 nm, the ridge structure guides electric current to the active layer and is effective in reducing the threshold current.

In the III-nitride semiconductor laser diode according to the present invention, preferably, a material of the confining portion is at least one of silicon oxide, silicon nitride, and aluminum nitride. When this III-nitride semiconductor laser diode uses one of the above materials, it can provide protection of the ridge structure and optical confinement.

In the III-nitride semiconductor laser diode according to the present invention, preferably, the ridge structure is buried by the confining portion, a material of the confining portion contains at least one of AlGaN and InAlGaN, the active layer includes a well layer extending along a plane intersecting with a normal to the primary surface of the support base, a lattice constant of the c-axis of the confining portion has a first lattice constant component D1 when the c-axis of the confining portion is projected onto the plane, a lattice constant of the c-axis of the well layer has a second lattice constant component D2 when the c-axis of the well layer is projected onto the plane, and a difference (D1−D2)/D2 in lattice constant between the confining portion and the well layer of the active layer is not more than 3%. This III-nitride semiconductor laser diode provides an excellent device lifetime.

In the III-nitride semiconductor laser diode according to the present invention, preferably, a thickness of the confining portion is not less than 50 nm and not more than 500 nm. This III-nitride semiconductor laser diode provides significant optical confinement and current confinement.

In the III-nitride semiconductor laser diode according to the present invention, preferably, the thickness of the confining portion is not less than 50 nm and not more than 300 nm. This III-nitride semiconductor laser diode provides better optical confinement and current confinement.

The above object and other objects, features, and advantages of the present invention will more readily become clear from the following detailed description of preferred embodiments of the present invention proceeding with reference to the accompanying drawings.

ADVANTAGEOUS EFFECTS OF INVENTION

As described above, the foregoing aspect of the present invention provides the III-nitride semiconductor laser diode capable of lasing at a low threshold.

DESCRIPTION OF EMBODIMENTS

The expertise of the present invention can be readily understood in view of the following detailed description with reference to the accompanying drawings illustrated by way of example. Embodiments of the III-nitride semiconductor laser diode of the present invention T will be described below with reference to the accompanying drawings. The same portions will be denoted by the same reference signs as much as possible.

Figure 1:
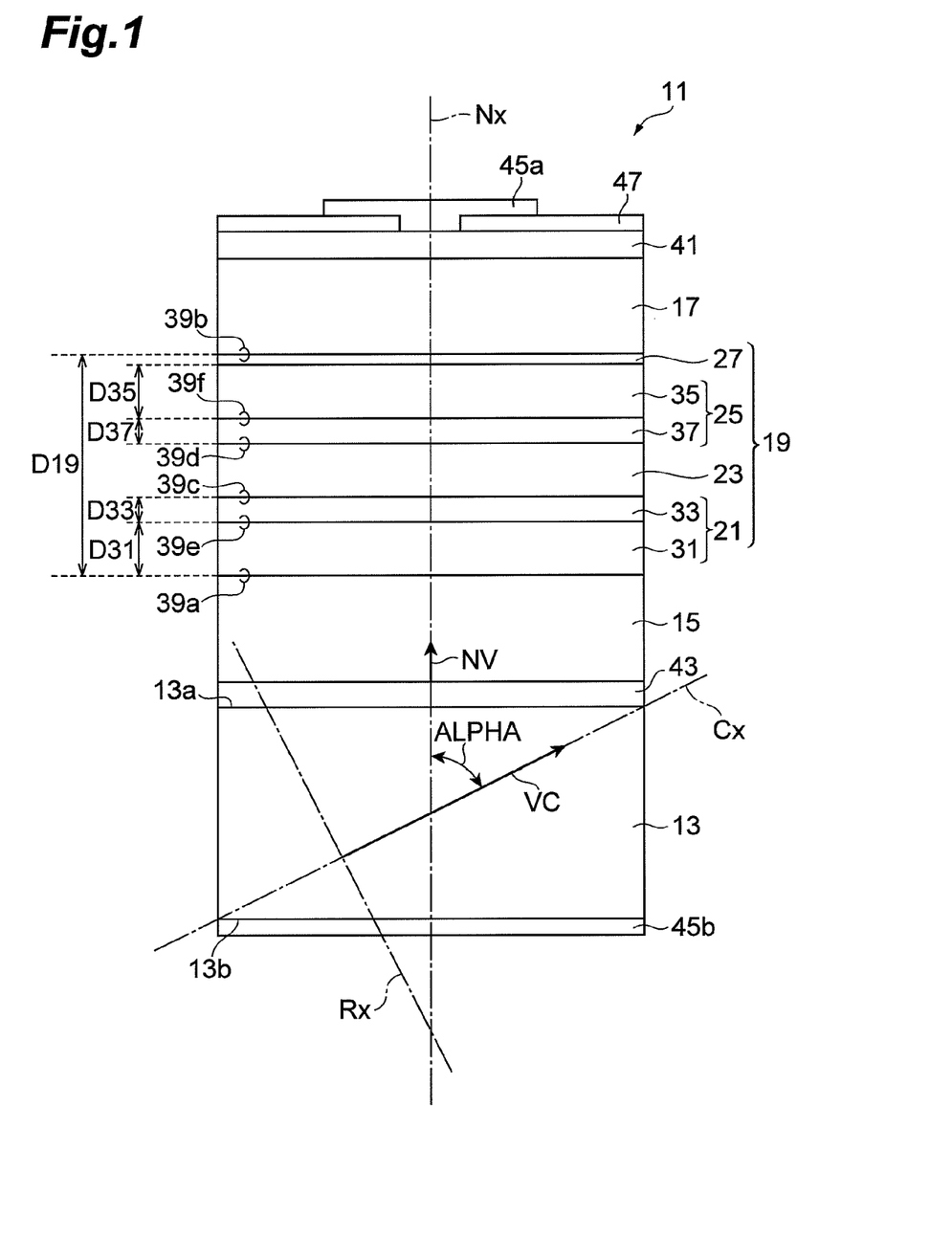
FIG. 1 is a drawing schematically showing a structure of a III-nitride semiconductor laser diode according to an embodiment of the present invention.

FIG. 1 is a drawing schematically showing a structure of a III-nitride semiconductor laser diode according to an embodiment of the present invention. The III-nitride semiconductor laser diode 11, which generates light of the lasing wavelength in the range of not less than 490 nm, will be described with reference to FIG. 1.

The III-nitride semiconductor laser diode 11 comprises a support base 13, an n-type cladding region 15, a p-type cladding region 17, and a core semiconductor region 19. The support base 13 comprises a III-nitride and the III-nitride can be made of, for example, GaN or the like. The support base 13 has a semipolar or nonpolar primary surface 13a and back surface 13b. The c-axis Cx of the III-nitride is inclined relative to the primary surface 13a. The n-type cladding region 15 comprises an n-type gallium nitride based semiconductor and may be made, for example, of AlGaN, InAlGaN, or the like. The p-type cladding region 17 comprises a p-type gallium nitride based semiconductor and may be made, for example, of AlGaN, InAlGaN, or the like. The n-type cladding region 15 and p-type cladding region 17 are provided above the primary surface 13a of the support base 13. The core semiconductor region 19 is provided between the n-type cladding region 15 and the p-type cladding region 17. The core semiconductor region 19 includes a first optical guide layer 21, an active layer 23, and a second optical guide layer 25. The active layer 23 is provided between the first optical guide layer 21 and the second optical guide layer 25. The thickness D19 of the core semiconductor region 19 is not less than 0.5 μm. The thickness D19 is more preferably not less than 0.6 μm.

In this III-nitride semiconductor laser diode 11, the core semiconductor region 19 includes the first optical guide layer 21, active layer 23, and second optical guide layer 25, and the thickness D19 of the core semiconductor region 19 is not less than 0.5 μm. This structure can confines light into the core semiconductor region 19 without leakage of light to the support base 13, and therefore enables reduction in threshold current.

In the III-nitride semiconductor laser diode 11, the active layer 23 may be composed of a single layer, or may have a quantum well structure. If necessary, the quantum well structure may include well and barrier layers, which are alternately-arranged. The well layers may comprise InGaN or the like and the barrier layers may comprise GaN, InGaN, or the like. In an example, the thickness of the well layers may be, for example, 3 nm, the thickness of the barrier layers may be, for example, 15 nm, and the number of the well layers may be, for example, 3. The emission wavelength of the active layer 23 is controlled by the bandgap of the well layers, the In composition, the thickness, etc. thereof.

The active layer 23 may be provided so as to emit light in the wavelength range of not less than 490 nm and not more than 510 nm. The thickness D19 of the core semiconductor region 19 is preferably not less than 0.5 μm. The thickness D19 is preferably in the range of not more than 1.5 μm. In this range of the thickness D19, mode stability of light is achieved in emission in the wavelength range of not less than 490 nm and not more than 510 nm, resulting in a low threshold.

Alternatively, the active layer 23 may be provided so as to emit light in the wavelength range of not less than 500 nm and not more than 520 nm. The thickness D19 of the core semiconductor region 19 is preferably not less than 1.0 μm. The thickness D19 is preferably not more than 1.5 μm. In this range of the thickness D19, a low threshold can be provided in emission in the wavelength range of not less than 500 nm and not more than 520 nm.

The n-type cladding region 15 may comprise ternary AlGaN and/or quaternary InAlGaN. The p-type cladding region 17 may comprise ternary AlGaN and/or quaternary InAlGaN.

With reference to FIG. 1, the first optical guide layer 21, active layer 23, and second optical guide layer 25 are arranged along an axis Nx normal to the primary surface 13a of the support base 13. An inclination angle of the primary surface 13a of the support base 13 is defined by angle ALPHA formed between a normal vector NV indicating the normal axis Nx and a c-axis vector VC indicating the c-axis direction. This angle ALPHA may be in the range of not less than 10 degrees and not more than 80 degrees or in the range of not less than 100 degrees and not more than 170 degrees with respect to a reference plane Rx perpendicular to the c-axis of the III-nitride. The support base 13 may be, for example, GaN and can provide the semipolar nature of GaN in the foregoing angle range. Furthermore, the inclination angle ALPHA is preferably in the range of not less than 63 degrees and not more than 80 degrees or in the range of not less than 100 degrees and not more than 117 degrees. In this angle range, the active layer 23 is provided with the InGaN layers with the In composition suitable for emission of not less than 500 nm.

In the III-nitride semiconductor laser diode 11, the first optical guide layer 21 may include a first GaN layer 31 and a first InGaN layer 33. The In composition of the InGaN layer 33 is smaller than that of the InGaN well layers in the active layer 23. The first GaN layer 31 is provided between the n-type cladding region 15 and the first InGaN layer 33, and the first InGaN layer 33 is provided between the active layer 23 and the first GaN layer 31. The n-type cladding region 15 is provided between the first optical guide layer 21 and the support base 13. In this structure, the semiconductor region between support base 13 and active layer 23 can be provided with the thickness and refractive index profile of the core semiconductor region 19 suitable for optical confinement.

The III-nitride semiconductor laser diode 11 may further include a p-type contact layer 41 provided on the p-type cladding region 17. The p-type contact layer 41 may comprise, for example, GaN, AlGaN, or the like. The III-nitride semiconductor laser diode 11 may further include an n-type buffer layer 43 provided between the n-type cladding region 15 and the support base 13. The n-type buffer layer 43 may comprise GaN or the like. An anode electrode 45a is in contact with the p-type contact layer 41 through an aperture of insulating film 47. A cathode electrode 45b is in contact with the back surface 13b of the support base 13.

In the III-nitride semiconductor laser diode 11, the second optical guide layer 25 may include a second GaN layer 35 and a second InGaN layer 37. The In composition of the InGaN layer 37 is smaller than that of the InGaN well layers in the active layer 23. The second GaN layer 35 is provided between the p-type cladding region 17 and the second InGaN layer 37. In addition to the region on the n-type cladding region 15 side, the semiconductor layers between the p-type cladding region 17 and the active layer 23 are provided with the thickness and refractive index profile for the core semiconductor region 19 suitable for optical confinement.

In the III-nitride semiconductor laser diode 11, the first InGaN layer 33 is undoped and the conductivity type of the first GaN layer 31 is n-type. The second InGaN layer 37 is undoped and the conductivity type of the second GaN layer 35 is p-type. Since the first and second InGaN layers 33, 37 are undoped, it is feasible to avoid optical absorption by a dopant. However, those InGaN layers may be doped in order to achieve low resistance for the purpose of driving at low operating voltage. Since the first and second GaN layers 31, 35 are doped with respective dopants, the first and second GaN layers 31, 35 can have reduced resistance.

In the III-nitride semiconductor laser diode 11, the n-type cladding region 15 may comprise ternary AlGaN and/or quaternary InAlGaN. When the n-type cladding region 15 comprises a ternary AlGaN layer, the n-type cladding region 15 preferably includes an $Al_XGa_{1-X}N$ (0.03<X<0.10) layer. The Al composition X of this $Al_XGa_{1-X}N$ layer is larger than 0.03. The Al composition X in this level is suitable for obtaining the bandgap difference between the optical guide layer 21 and the n-type cladding region 15. The Al composition X of the $Al_XGa_{1-X}N$ layer is preferably smaller than 0.10. The Al composition being too large will lead to increase in strain in the n-side AlGaN cladding layer. Since the n-type AlGaN layer in the above Al composition range is provided between the support base 13 and the active layer 23, it is suitable for optical confinement into the core semiconductor region 19 without spread of light into the support base 13, resulting reduction in the threshold current. Furthermore, the Al composition X of $Al_XGa_{1-X}N$ in the n-type cladding region 15 is preferably not less than 0.05. This cladding structure is more suitable for confining light into the core semiconductor region 19 without spread of light to the support base 13.

The p-type cladding region 17 may comprise ternary AlGaN and/or quaternary InAlGaN. When the p-type cladding region 17 comprises ternary AlGaN, the p-type cladding region 17 preferably includes an $Al_YGa_{1-Y}N$ (0.03<Y<0.10) layer. The Al composition Y of this $Al_YGa_{1-Y}N$ layer is larger than 0.03. The Al composition Y in this level is suitable for obtaining the bandgap difference between the optical guide layer 35 and the p-type cladding region 17. The Al composition Y of this $Al_YGa_{1-Y}N$ layer is smaller than 0.10. The Al composition being too large will lead to increase in strain in the $Al_YGa_{1-Y}N$ layer. Since the p-type AlGaN layer in the foregoing Al composition range provides an excellent refractive index profile in the p-side semiconductor region, it is suitable for avoiding spread of light into the support base 13 to confine light into the core semiconductor region 19. Furthermore, the Al composition Y of $Al_YGa_{1-Y}N$ in the p-type cladding region 17 is preferably not less than 0.05. Since the refractive index profile in the p-side semiconductor region is made better, this structure is suitable for avoiding spread of light to the support base 13 and confining light in the core semiconductor region 19.

With reference to FIG. 1, the core semiconductor region 19 may further include an electron block layer 27. The electron block layer 27 may comprise, for example, $Al_ZGaN_{1-Z}$ and the Al composition Z of this $Al_ZGaN_{1-Z}$ is larger than the Al composition Y of the $Al_YGa_{1-Y}N$ layer of the p-type cladding region 17. The second optical guide layer 25 may further include the electron block layer 27. In an example, as shown in FIG. 1, the electron block layer 27 may be provided between the second GaN layer 35 and the p-type cladding region 17. In another example, the electron block layer 27 may be provided between the second InGaN layer 37 and the second GaN layer 35.

The n-type cladding region 15 makes a junction 39a with the core semiconductor region 19; specifically, the n-type cladding region 15 makes the junction 39a with the first optical guide layer 21. The p-type cladding region 17 makes a junction 39b with the core semiconductor region 19; specifically, the p-type cladding region 17 makes the junction 39b with the second optical guide layer 25. The first optical guide layer 21 makes a junction 39c with the active layer 23. The active layer 23 makes a junction 39d with the second optical guide layer 25. The first GaN layer 31 makes a junction 39e with the first InGaN layer 33. The second GaN layer 35 makes a junction 39f with the second InGaN layer 37.

In an example, the sum of the thickness D31 of the first GaN layer 31 and the thickness D35 of the second GaN layer 35 is preferably not less than 450 nm. The sum of the thickness D33 of the first InGaN layer 33 and the thickness D37 of the second InGaN layer 37 is preferably smaller than the sum of the thickness D31 of the first GaN layer 31 and the thickness D35 of the second GaN layer 35. This structure can provide the core semiconductor region 19 between the active layer 23 and the support base 13 with the excellent profile of thickness and refractive index, and for this reason, it can reduce the threshold.

Furthermore, the thickness D31 of the first GaN layer 31 is preferably not less than 550 nm. The thickness D35 of the second GaN layer 35 is preferably not less than 550 nm. This achieves a lower threshold. This structure allows the confinement of long wavelength light into the core semiconductor region 19.

EXAMPLES

A laser structure is produced on GaN substrate 51. An n-type GaN substrate is prepared. A primary surface of this GaN substrate has a semipolar (20-21) plane. Gallium nitride based semiconductor layers are grown on this substrate by metal-organic vapor phase epitaxy. Source gases of matrix materials used herein are as follows: trimethyl gallium (TMG); trimethyl aluminum (TMA); trimethyl indium (TMI); ammonia ($NH_3$). The n-type and p-type dopants used herein are as follows: silane; trimethyl magnesium. LD structures comprised of the following films are grown using these raw materials: n-type GaN buffer layer; n-type (In)AlGaN cladding layer; n-type GaN optical guide layer; undoped InGaN optical guide layer; InGaN active layer; undoped InGaN optical guide layer; p-type GaN optical guide layer; p-type (In)AlGaN cladding layer; and p-type GaN cap layer. Epitaxial substrates with the LD structures having different thicknesses of the core semiconductor region are produced.

Figure 2:
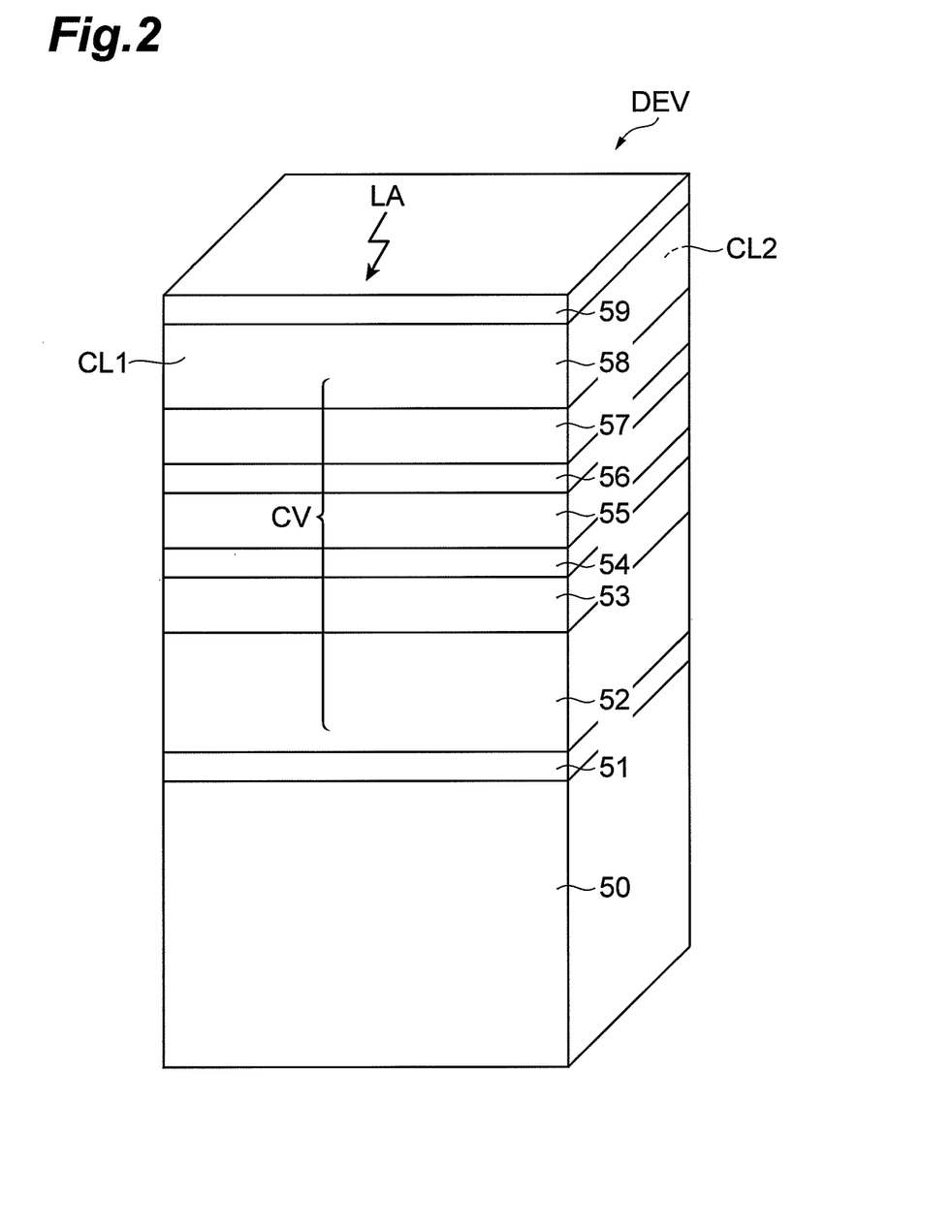
FIG. 2 is a drawing showing a device structure in an example.

With devices produced by cleavage of the individual epitaxial substrates, the far field pattern (FFP) is observed to estimate generation of lasing oscillation and lasing threshold. For this estimation, each of these individual devices is irradiated with strong excitation light LA from the outside to induce lasing. The device DEV shown in FIG. 2 includes the GaN support base 50, the aforementioned semiconductor laminate (n-type GaN buffer layer 51; n-type AlGaN cladding layer 52; n-type GaN optical guide layer 53; undoped InGaN optical guide layer 54; InGaN active layer 55; undoped InGaN optical guide layer 56; p-type GaN optical guide layer 57; p-type AlGaN cladding layer 58; p-type GaN cap layer 59), a pair of cleaved facets CL1, CL2, and a laser cavity CV. Light is emitted by recombination of carrier pairs generated by absorption of the excitation light. This light travels back and forth in the core semiconductor region between the pair of cleaved facets to cause lasing in the laser cavity. The intensity of the excitation light has a correlation with the threshold necessary for the lasing.

Figure 3:
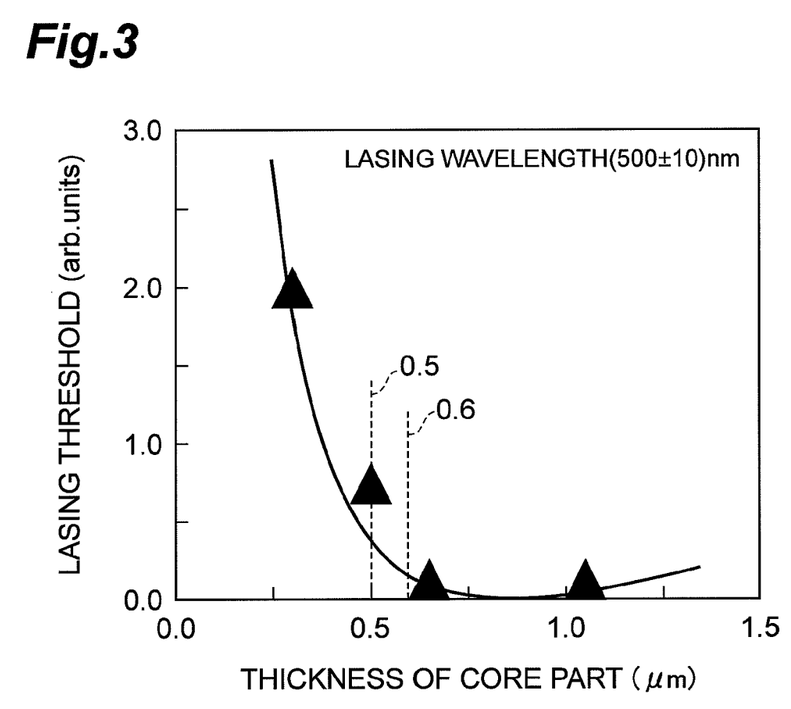
FIG. 3 is a drawing showing a relation of core semiconductor region and lasing threshold in a region around the lasing wavelength of 500 nm (from 490 nm to 510 nm).

FIG. 3 is a drawing showing a relation of the core semiconductor region and lasing threshold in a wavelength region around the lasing wavelength of 500 nm (490 nm-510 nm). The In composition of the InGaN active layer in this LD structure is 25%. When the thickness of the core semiconductor region is approximately 0.5 μm, FFP observation has shown that light in a certain mode can be stably confined in the core and has confirmed that the device can lase at a low excitation power (i.e., a low threshold). When the thickness of the core semiconductor region is as large as 0.6 μm or more, the threshold is made sufficiently low. Based on the results of various experiments, the thickness of the core semiconductor region is preferably not less than 0.5 μm and not more than 1.5 μm.

Figure 4:
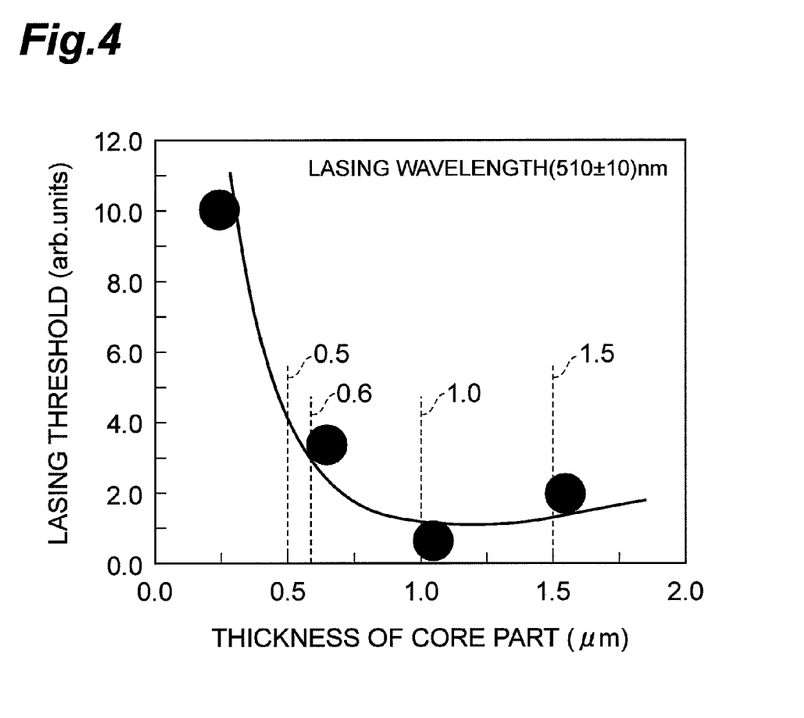
FIG. 4 is a drawing showing a relation of core semiconductor region and lasing threshold in a region around the lasing wavelength of 510 nm (from 500 nm to 520 nm).

FIG. 4 is a drawing showing a relation of the core semiconductor region and lasing threshold in a region around the emission wavelength of 510 nm (500 nm-520 nm). The In composition of the InGaN active layer in this LD structure is 30%. When the thickness of the core semiconductor region is about 1.0 μm, FFP observation has shown that light in a certain mode can be stably confined into the core and has confirmed that the device can lase at a low excitation power (i.e., a low threshold). Based on the results of various experiments, the thickness of the core semiconductor region is preferably not less than 1.0 μm and not more than 1.5 μm.

The threshold characteristic curves shown in FIGS. 3 and 4 show the following behaviors. The threshold current decreases with increase in the thickness of the core semiconductor region. The threshold current takes a minimum value at a certain thickness of the core semiconductor region. Thereafter, the threshold current increases with increase in the thickness of the core semiconductor region.

The results of various experiments are as described below.

Experiment Result 1

| Thickness of guide layers (μm), | | Lasing threshold |
| --- | --- | --- |
| $In_{0.01}Ga_{0.99}N$ layers, | GaN layers. | (relative value) |
| 0.05 | 0.25 | 2.0 |
| 0.05 | 0.45 | 0.8 |
| 0.05 | 0.60 | 0.1 |
| 0.05 | 1.00 | 0.1 |

Experiment Result 2

| Thickness of guide layers (μm), | | Lasing threshold |
| --- | --- | --- |
| $In_{0.01}Ga_{0.99}N$ layers, | GaN layers. | (relative value) |
| 0.10 | 0.20 | 3.0 |
| 0.10 | 0.40 | 0.6 |
| 0.10 | 0.55 | 0.1 |

Experiment Result 3

| Thickness of guide layers (μm), | | Lasing threshold |
| --- | --- | --- |
| $In_{0.02}Ga_{0.98}N$ layers, | GaN layers | (relative value) |
| 0.05 | 0.25 | 2.0 |
| 0.05 | 0.45 | 0.1 |
| 0.05 | 0.60 | 0.1 |

From the above experiment results, the total thickness of the first GaN layer and the second GaN layer in the guide layers is preferably not less than 450 nm. The total thickness of the foregoing GaN layers in the guide layers is more preferably not less than 550 nm. Furthermore, the sum of the thicknesses of the GaN layers in the guide layers is particularly preferably not less than 600 nm. From the comparison between above Experiment Results 1 and 2, the threshold decreases with increase in the thickness of the InGaN guide layers. This is because optical confinement of the core part is made stable, and the thickness of the InGaN layers is preferably not less than 0.1 μm. The In composition of the InGaN guide layers is preferably not less than 1%.

The present embodiment enables fabrication of the laser diode with a low threshold current and long lifetime. The present embodiment is effective for semipolar planes (e.g., (10-1-1) plane, (10-1-3) plane, (11-22) plane, and so on), nonpolar m-planes, and nonpolar a-planes, which are not c-planes.

A factor to impede lasing of 500 nm on a c-plane is one except for optical confinement, and the cause thereof is reduction in luminous efficiency caused by piezoelectric polarization in the growth direction of the active layer, which is peculiar to the c-plane. On the other hand, in the present embodiment, each optical guide layer can be made of GaN, and is preferably made of a gallium nitride based semiconductor containing In as a constituent element, and this case, the threshold is made low further. The InGaN layer being too thick will affect crystals grown after the layer. At least a part of the optical guide layer is preferably doped with dopant to control the conductivity of n-type or p-type, which can reduce electrical resistance of the optical guide layer. This low resistance is one of important factors for achieving lasing at a low threshold. However, a part of the optical guide layer may be comprised of an undoped semiconductor and, in order to obtain the better performance, it is preferable that the active layer be sandwiched directly between the guide layers which are made of the undoped semiconductor. This structure can stably achieve the low threshold.

The material of each cladding layer may be AlGaN in the Al composition of not less than 0.03 (or 0.05 for the good result) and not more than 0.10, to realize both high crystallinity and low-threshold lasing. When this cladding layer is made of a quaternary mixed crystal of InAlGaN, the cladding layer can achieve lattice matching with the GaN substrate, thereby achieving the lasing at a lower threshold. The active layer preferably includes a gallium nitride based semiconductor layer containing In atoms as a constituent element.

In terms of the long life of the laser diode, the dislocation densities of the GaN substrate and the active layer grown thereon are preferably not more than $1 \times 10^7$ cm$^{-2}$.

In the green laser diode of not less than 500 nm, when the thickness of the core is not less than 0.6 μm, it becomes feasible to stably confine light thereinto and to achieve green lasing at a low threshold.

In order to obtain the lasing wavelength of about 500 nm (green), the optical guide layers need to be grown thick although the guide layers used are those entirely comprised of InGaN. But, it is not easy to obtain a thick InGaN film with excellent crystal quality, and a film thickness to ensure excellent crystal quality does not satisfy the required thickness and provides reduced optical confinement in the wavelength range of not less than 500 nm. This will result in failure in lasing or make the lasing threshold current density very high. According to Inventors' knowledge, in the lasing in the wavelength range of not less than 500 nm, it is very important in lasing to make a mode of light stably stand in the core semiconductor region including the active layer and the optical guide layers. Consequently, the total thickness of the p-side and n-side optical guide layers and the active layer is significant for stable standing of the mode. For this stability, it is important to reduce the leakage of light into the support base of the refractive index lower than that of the cladding region. For this reason, the thickness of the core semiconductor region is also important, as well as the relative index difference.

Figure 5:
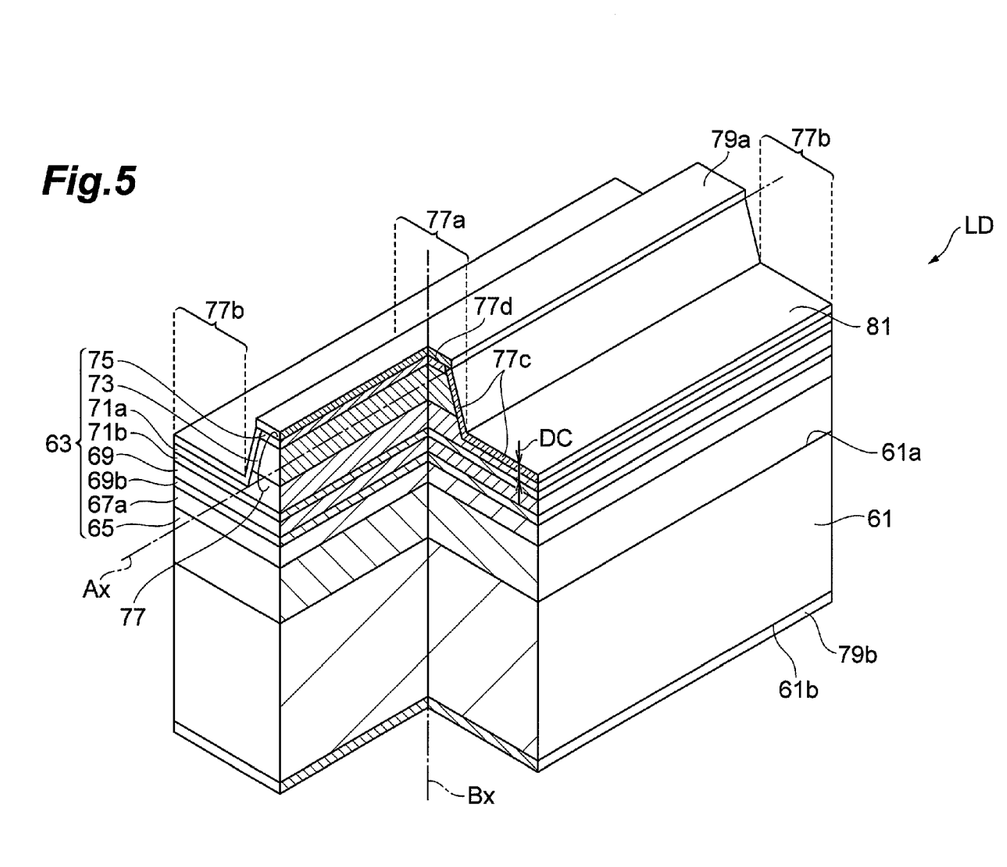
FIG. 5 is a drawing showing a device structure in an example.

FIG. 5 is a drawing showing a device structure in an example. In the laser diode LD, an epitaxial semiconductor region 63 is formed on a primary surface 61a of GaN support base 61. The epitaxial semiconductor region 63 includes an n-type AlGaN cladding layer 65, an n-type GaN optical guide layer 67a, an undoped InGaN optical guide layer 67b, an active layer 69, an undoped InGaN optical guide layer 71b, a p-type GaN optical guide layer 71a, a p-type AlGaN cladding layer 73, and a p-type GaN contact layer 75. A ridge structure 77 includes the p-type GaN optical guide layer 71a, p-type AlGaN cladding layer 73, and p-type GaN contact layer 75. An anode electrode 79a makes a junction with the p-type GaN contact layer 75, and a cathode electrode 79b makes a junction with a back surface 61b of the GaN support base 61. The ridge structure shown in FIG. 5 is formed for current confinement in the laser diode LD providing the lasing at the wavelength of not less than 500 nm. A surface 77c of the ridge structure 77 is covered by a confining layer 81, except for a top face 77d of the ridge structure 77. For forming the ridge structure 77, a striped mask is formed on the epitaxial substrate by photolithography. After formation of this mask, the p-type contact layer, the p-type cladding layer, and at least a part of the optical guide layer of the epitaxial substrate are removed by dry etching, thereby forming the ridge structure 77. The ridge structure 77 includes a ridge portion 77a and first and second side portions 77b. The ridge portion 77a extends in a direction of a predetermined axis, and the first and second side portions 77b extend in the direction of predetermined axis Ax and are adjacent to the ridge portion 77a on the first and second sides, respectively, of the ridge portion 77a. The ridge portion 77a is located between the first and second side portions 77b. The ridge portion 77a includes the top face 77d and side faces 77e, 77f. Each of the side faces 77e, 77f is inclined relative to the top face 77d and inclined relative to a primary surface of the side portions 77b. After formation of the ridge portion, a confining portion is formed on the ridge portion 77a and on the surfaces 77c of the first and second side portions 77b. The confining portion may be formed so as to bury the ridge portion. A material of the confining portion 81 is, for example, silicon oxide. In the present example, thereafter, the mask is removed by lift-off process to form an aperture in the confining portion 81. This forms the aperture for an electrode in a self-alignment manner with the ridge portion 77a. The top face 77d is exposed in the aperture. The formation of the aperture does not always have to be limited to the lift-off process. After this, the p-type electrode and n-type electrode are formed by vapor deposition.

After formation of the ridge structure 77, laser diodes with the upper guide layer 71a in various thicknesses are produced. For example, in the laser diode in which the thickness of the side portions 77b of the ridge structure 77 is adjusted so as to leave the upper guide layer 71a in the thickness larger than half of the entire thickness thereof (e.g., where the thickness of the side portions is 400 nm), the lasing threshold current shows little reduction and is 800 mA, when compared with the laser diode without the ridge structure 77. On the other hand, in the laser diode in which the upper guide layer 71a is etched to the thickness not more than half of the total thickness thereof, the lasing threshold current reduces remarkably to 200 mA.

An experiment is conducted to investigate a relation of the lasing threshold and the remaining thickness DC of the upper guide layer 71a, and the experiment result shows that the thickness DC of the upper guide layer is preferably not less than 10 nm and not more than 250 nm and more preferably not less than 10 nm and not more than 200 nm.

The material of the confining portion 81 is an insulator such as silicon oxide, but in place of silicon oxide, it may be at least one of silicon nitride and aluminum nitride. These materials can also provide the same optical confinement effect as silicon oxide. The confining portion 81 has the refractive index smaller than that of the optical guide layer 71a. When the material of the confining portion is a III-nitride such as AlGaN or InAlGaN, this confining portion achieves the same or similar optical confinement effect. This III-nitride may have the bandgap larger than those of the p-type cladding layer and p-type contact layer. The laser diodes with the confining portion using the semiconductor materials such as AlGaN and InAlGaN has the long device lifetime approximately equal to double that of the laser diodes using silicon oxide and silicon nitride. The reasons therefor are that the lattice constants of the III-nitride for the embedding material and the active layer are close to each other and expansion coefficients thereof are also close to each other and that addition of the confining portion causes little increase in strain in the active layer.

Based on this expertise, further experiment is conducted. With a III-nitride containing indium with the atomic radius larger than that of gallium and containing aluminum with the atomic radius smaller than that of gallium, it is feasible to adjust the lattice constant, bandgap, and refractive index by its Al composition and In composition. For example, by adjusting the Al composition and/or the In composition in AlGaN and InAlGaN, it is feasible to achieve optical confinement by reduction of the refractive index relative to the active layer and to reduce in-plane strain of the active layer due to the lattice constant difference between the confining portion and the active layer. Laser diodes are produced with the confining layers comprised of III-nitrides having several compositions. The in-plane strains of these layers are 0.5%, 3.0%, and 10%. In these laser diodes, the laser diode tends to improve reliability when the absolute value of in-plane strain is not more than 3%.

The in-plane strain is defined as follows. The lattice constant difference between the confining portion and the well layer of the active layer is defined by the following expression.

$$(D1-D2)/D2$$

The lattice constant of the c-axis of the III-nitride for the confining portion 81 has a first lattice constant component D1 when the c-axis of the confining portion 81 is projected onto a reference plane. The lattice constant of the c-axis of the gallium nitride based semiconductor for the well layer of the active layer 69 has a second lattice constant component D2 when the c-axis of the well layer is projected onto the reference plane. The composition of the material of the confining portion 81 is adjusted so that the lattice constant difference (D1-D2)/D2 between the confining portion 81, and the well layer of the active layer 69 becomes not more than 3%. The reference plane intersects with a normal Bx to the primary surface 61a of the support base 61, and the well layer of the active layer 69 extends along the reference plane. This reference plane can be defined, for example, in parallel with the primary surface 61a of the support base 61.

From investigation of the relation between the thickness of the confining portion 81 and the lasing threshold, the thickness of the confining portion 81 is preferably not more than 500 nm and more preferably not more than 300 nm. It is considered that when the thickness of the confining portion 81 becomes not more than 50 nm, the optical confinement by the confining portion 81 becomes insufficient and the lasing threshold current increases.

Having illustrated and explained the principle of the present invention with the preferred embodiments thereof, and it should be noted that it is obvious to those skilled in the art that the present invention can be modified in arrangement and detail without departing from the principle. The present invention is by no means intended to be limited to the specific configurations disclosed in the embodiments. Therefore, the applicant claims all modifications and changes coming from the scope of claims and the scope of spirit thereof.

INDUSTRIAL APPLICABILITY

As described above, the embodiment provides the III-nitride semiconductor laser diode capable of lasing at the low threshold.

REFERENCE SIGNS LIST

11 III-nitride semiconductor laser diode;
13 . . . support base;
13a . . . primary surface;
13b . . . back surface;
15 . . . n-type cladding region;
17 . . . p-type cladding region;
19 . . . core semiconductor region;
21 . . . first optical guide layer;
23 . . . active layer;
25 . . . second optical guide layer;
D19 . . . thickness of core semiconductor region;
Nx . . . normal axis;
NV normal vector;
VC . . . c-axis vector;
ALPHA . . . angle;
31 . . . first GaN layer;
33 . . . first InGaN layer;
35 second GaN layer;
37 . . . second InGaN layer;
41 p-type contact layer;
43 . . . n-type buffer layer;
47 . . . insulating film;
45a . . . anode electrode;
45b . . . cathode electrode;
50 GaN support base;
51 . . . n-type GaN buffer layer;
52 . . . n-type AlGaN cladding layer;
53 . . . n-type GaN optical guide layer;
54 . . . undoped InGaN optical guide layer;
55 . . . InGaN active layer;
56 . . . undoped InGaN optical guide layer;
57 . . . p-type GaN optical guide layer;
58 . . . p-type AlGaN cladding layer;
59 . . . p-type GaN cap layer;
CL1, CL2 . . . a pair of cleaved facets;
CV . . . laser cavity;
LA . . . excitation light;
DEV . . . device;
61 . . . GaN support base;
63 . . . epitaxial semiconductor region;
65 . . . n-type AlGaN cladding layer;
67a . . . n-type GaN optical guide layer;
67b . . . undoped InGaN optical guide layer;

69 . . . active layer;
71b . . . undoped InGaN optical guide layer;
71a . . . p-type GaN optical guide layer;
73 . . . p-type AlGaN cladding layer;
75 . . . p-type GaN contact layer;
77 . . . ridge structure;
79a . . . anode electrode;
79b . . . cathode electrode;
81 . . . confining portion.

The invention claimed is:

1. A III-nitride semiconductor laser diode to emit light at a wavelength of not less than 490 nm, comprising:
a support base comprising a III-nitride, the support base including a primary surface, and the primary surface having one of semipolar nature and nonpolar nature;
an n-type cladding region provided above the support base;
a p-type cladding region provided above the support base; and
a core semiconductor region provided between the p-type cladding region and the n-type cladding region,
the n-type cladding region comprising an n-type gallium nitride based semiconductor,
the p-type cladding region comprising a p-type gallium nitride based semiconductor,
the core semiconductor region comprising a first optical guide layer, an active layer and a second optical guide layer,
the first optical guide layer including a first GaN layer,
the second optical guide layer including a second GaN layer and a second InGaN layer,
the active layer being in physical contact with the second InGaN layer,
the second InGaN layer being in physical contact with the second GaN layer;
the second GaN layer being in physical contact with the p-type cladding region,
the active layer being provided between the first optical guide layer and the second optical guide layer, and
a total thickness of the first GaN layer and the second GaN layer being not less than 600 nm,
wherein the primary surface is inclined at an inclination angle in one of a range of not less than 63 degrees and not more than 80 degrees and a range of not less than 100 degrees and not more than 117 degrees with reference to a reference plane perpendicular to a c-axis of the III-nitride in a direction from the c-axis to an m-axis of the III-nitride.

2. The III-nitride semiconductor laser diode according to claim 1, wherein the first optical guide layer includes a first InGaN layer,
wherein the first InGaN layer is provided between the active layer and the first GaN layer,
wherein the n-type cladding region is provided between the first GaN layer and the support base,
wherein the second optical guide layer includes the second InGaN layer, and
wherein the second InGaN layer is provided between the active layer and the second GaN layer.

3. The III-nitride semiconductor laser diode according to claim 2, wherein the first InGaN layer is undoped,
wherein the first GaN layer hass n-type,
wherein the second InGaN layer is undoped, and
wherein the second GaN layer has p-type.

4. A III-nitride semiconductor laser diode, comprising:
a support base comprising a III-nitride, the support base including a primary surface, and the primary surface having one of semipolar nature and nonpolar nature;
an n-type cladding region provided above the support base;
a p-type cladding region provided above the support base; and
a core semiconductor region provided between the p-type cladding region and the n-type cladding region,
the n-type cladding region comprising an n-type gallium nitride based semiconductor,
the p-type cladding region comprising a p-type gallium nitride based semiconductor,
the core semiconductor region comprising a first optical guide layer, an active layer and a second optical guide layer,
the active layer being provided so as to emit light at a wavelength in a range of not less than 490 nm and not more than 520 nm,
the first optical guide layer including a first InGaN layer and a first GaN layer,
the second optical guide layer including a second InGaN layer a second GaN layer,
the active layer being in physical contact with the second InGaN layer,
the second InGaN layer being in physical contact with the second GaN layer,
the second GaN layer being in physical contact with the p-type cladding region,
the active layer being in physical contact with the first InGaN layer,
the first InGaN layer being in physical contact with the first GaN layer,
the first GaN layer being in physical contact with the n-type cladding region,
the active layer being provided between the first optical guide layer and the second optical guide layer,
a sum of thicknesses of the first GaN layer and the second GaN layer being not less than 450 nm, and
a total thickness of the first InGaN layer and the second InGaN layer being smaller than a thickness of the first GaN layer,
wherein the primary surface is inclined at an inclination angle in one of a range of not less than 63 degrees and not more than 80 degrees and a range of not less than 100 degrees and not more than 117 degrees with reference to a reference plane perpendicular to a c-axis of the III-nitride in a direction from the c-axis to an m-axis of the III-nitride.

5. A III-nitride semiconductor laser diode, comprising:
a support base comprising a III-nitride, the support base including a primary surface, and the primary surface having one of semipolar nature and nonpolar nature;
an n-type cladding region provided above the support base;
a p-type cladding region provided above the support base; and
a core semiconductor region provided between the p-type cladding region and the n-type cladding region,
the n-type cladding region comprising an n-type gallium nitride based semiconductor,
the p-type cladding region comprising a p-type gallium nitride based semiconductor,
the core semiconductor region comprising a first optical guide layer, an active layer and a second optical guide layer,
the active layer being provided so as to emit light at a wavelength in a range of not less than 490 nm and not more than 520 nm,
the first optical guide layer including a first GaN layer,
the second optical guide layer including a second GaN layer and a second InGaN layer, the active layer being in physical contact with the second InGaN layer, the second InGaN layer being in physical contact with the second GaN layer;

the second GaN layer being in physical contact with the p-type cladding region, the p-type cladding region and the second optical guide layer having a ridge structure, the second optical guide layer including a ridge portion for the ridge structure and a side portion adjacent to the ridge portion, the p-type cladding region being located on the ridge portion to form the ridge structure, and the side portion including the second GaN layer and the second InGaN layer, and the III-nitride semiconductor laser diode further comprising an insulating film, the insulating film covering a top surface of the side portion, and the insulating film being in physical contact with the second GaN layer of the second optical guide layer in the side portion, the active layer being provided between the first optical guide layer and the second optical guide layer, and a sum of thicknesses of the first GaN layer and the second GaN layer being not less than 550 nm, wherein the primary surface is inclined at an inclination angle in one of a range of not less than 63 degrees and not more than 80 degrees and a range of not less than 100 degrees and not more than 117 degrees with reference to a reference plane perpendicular to a c-axis of the III-nitride in a direction from the c-axis to an m-axis of the III-nitride.

6. The III-nitride semiconductor laser diode according to claim 2, wherein an In composition of the first InGaN layer is not less than 1%.

7. The III-nitride semiconductor laser diode according to claim 1, wherein the n-type cladding region includes an $Al_xGa_{1-x}N$ (0.03<X<0.10) layer.

8. The III-nitride semiconductor laser diode according to claim 7, wherein an Al composition of the $Al_xGa_{1-x}N$ of the n-type cladding region is not less than 0.05.

9. The III-nitride semiconductor laser diode according to claim 1, wherein the support base comprises GaN, and wherein the active layer comprises an InGaN layer.

10. The III-nitride semiconductor laser diode according to claim 1, wherein the active layer is provided so as to emit light at a wavelength in a range of not less than 490 nm and not more than 510 nm, and wherein a thickness of the core semiconductor region is not more than 1.5 μm.

11. The III-nitride semiconductor laser diode according to claim 1, wherein the active layer is provided so as to emit light at a wavelength in a range of not less than 500 nm and not more than 520 nm, and wherein a thickness of the core semiconductor region is not more than 1.5 μm.

12. The III-nitride semiconductor laser diode according to claim 1, wherein the second optical guide layer is provided between the p-type cladding region and the active layer, wherein the p-type cladding region and the second optical guide layer have a ridge structure, wherein the second optical guide layer includes a ridge portion for the ridge structure and a side portion adjacent to the ridge portion, and wherein a thickness of the side portion is not more than half of a thickness of the ridge portion.

13. The III-nitride semiconductor laser diode according to claim 12, further comprising a confining portion provided on the ridge structure, wherein the confining portion has a refractive index smaller than that of the second optical guide layer.

14. The III-nitride semiconductor laser diode according to claim 13, wherein the thickness of the side portion of the second optical guide layer is not less than 10 nm and not more than 250 nm.

15. The III-nitride semiconductor laser diode according to claim 14, wherein the thickness of the side portion of the second optical guide layer is not less than 10 nm and not more than 200 nm.

16. The III-nitride semiconductor laser diode according to claim 13, wherein a material of the confining portion is at least one of silicon oxide, silicon nitride, and aluminum nitride.

17. The III-nitride semiconductor laser diode according to claim 13, wherein the confining portion buries the ridge structure, wherein a material of the confining portion contains at least one of AlGaN and InAlGaN, wherein the active layer includes a well layer extending along a plane intersecting with a normal to the primary surface of the support base, wherein a lattice constant of the c-axis of the confining portion has a first lattice constant component D1 defined by projection of the c-axis of the confining portion onto the plane, wherein a lattice constant of the c-axis of the well layer has a second lattice constant component D2 defined by projection of the c-axis of the well layer onto the plane, and wherein a lattice constant difference (D1−D2)/D2 between the confining portion and the well layer of the active layer is not more than 3%.

18. The III-nitride semiconductor laser diode according to claim 16, wherein a thickness of the confining portion is not less than 50 nm and not more than 500 nm.

19. The III-nitride semiconductor laser diode according to claim 17, wherein a thickness of the confining portion is not less than 50 nm and not more than 300 nm.

20. The III-nitride semiconductor laser diode according to claim 1, wherein the p-type cladding region comprises an AlGaN layer.

21. The III-nitride semiconductor laser diode according to claim 1, wherein the p-type cladding region comprises an InAlGaN layer.

22. The III-nitride semiconductor laser diode according to claim 1, wherein the p-type cladding region comprises an AlGaN layer and an InAlGaN layer.

* * * * *